(12) United States Patent
Smith et al.

(10) Patent No.: US 11,552,620 B2
(45) Date of Patent: Jan. 10, 2023

(54) EVENT ACTIVITY TRIGGER

(71) Applicant: Tektronix, Inc., Beaverton, OR (US)

(72) Inventors: Patrick A. Smith, Beaverton, OR (US); Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 16/894,778

(22) Filed: Jun. 6, 2020

(65) Prior Publication Data

US 2020/0304110 A1 Sep. 24, 2020

Related U.S. Application Data

(63) Continuation of application No. 14/995,008, filed on Jan. 13, 2016, now Pat. No. 10,680,588.

(51) Int. Cl.
 *G01R 13/02* (2006.01)
 *H03K 3/037* (2006.01)
 *H03K 19/20* (2006.01)

(52) U.S. Cl.
 CPC ......... *H03K 3/037* (2013.01); *G01R 13/0254* (2013.01); *H03K 19/20* (2013.01)

(58) Field of Classification Search
 CPC ............ G01R 13/0218; G01R 13/0254; G01R 13/0263; G01R 13/22; G01R 13/32; G01R 13/345; G01R 29/26; G01R 31/3177; G06F 11/25
 See application file for complete search history.

(56) References Cited

U.S. PATENT DOCUMENTS

| | | | | |
|---|---|---|---|---|
| 6,459,256 | B1 * | 10/2002 | Pickerd | G01R 13/345 |
| | | | | 324/121 R |
| 2003/0220753 | A1 * | 11/2003 | Pickerd | G01R 13/0254 |
| | | | | 702/67 |
| 2007/0222430 | A1 * | 9/2007 | Sullivan | G01R 13/0254 |
| | | | | 324/76.15 |
| 2017/0031336 | A1 * | 2/2017 | Lehane | G01R 13/0254 |

FOREIGN PATENT DOCUMENTS

| | | |
|---|---|---|
| JP | H01305364 | 12/1989 |
| JP | H07260827 | 10/1995 |
| JP | H0854418 | 2/1996 |
| JP | H0854418 A * | 2/1996 |

* cited by examiner

*Primary Examiner* — Seokjin Kim
(74) *Attorney, Agent, or Firm* — Miller Nash LLP; Andrew J. Harrington

(57) ABSTRACT

Methods of triggering a test and measurement instrument having a plurality of inputs include the step of generating a trigger signal in response to every occurrence of any one of a plurality of specified trigger events. A first specified trigger event occurs in at least a first one of the inputs and a second specified trigger event occurs in at least a second one of the plurality of inputs. A specified trigger event may include at least one selected input from the plurality of inputs and a selected activity type. Some methods include configuring each of a plurality of event activity detectors to produce a pulse in a logic signal in response to every occurrence of one of the specified trigger events. The plurality of logic signals are combined in a logical OR circuit to generate the trigger signal. Trigger circuits configured according to these methods are also disclosed.

14 Claims, 7 Drawing Sheets

US 11,552,620 B2

EVENT ACTIVITY TRIGGER

PRIORITY

This application is a continuation of U.S. patent application Ser. No. 14/995,008, filed Jan. 13, 2016, now issued U.S. Pat. No. 10,680,588, the contents of which are hereby incorporated by reference in their entirety.

TECHNICAL FIELD

This disclosure relates to test and measurement instruments, and more particularly to triggering a test and measurement instrument.

BACKGROUND

A test and measurement instrument, such as an oscilloscope, generally uses a trigger to mark a specific point in time in an input signal, and to cause the instrument's acquisition system to acquire the input signal data, thereby defining the specific portion of the input signal that will be stored in the instrument's memory. The trigger serves to synchronize the horizontal sweep of the instrument, allowing the instrument to show a stable depiction of the input signal on a display. The instrument may trigger on the same input signal that is shown on screen, or it may trigger on a different trigger source, such as another input signal, an external trigger signal, or even the line voltage signal. Conventional test and measurement instruments are capable of triggering on a wide variety of conditions that may be present in a trigger source signal. For example, all modern oscilloscopes include an edge trigger mode, which generates a trigger when the trigger source signal experiences an edge transition.

Many modern test and measurement instruments also include a logic trigger mode. The logic trigger mode is especially useful for verifying or troubleshooting the operation of digital logic. In the logic trigger mode, the instrument triggers on a logical combination (e.g. NOT, AND, OR, NAND, NOR) of Boolean words in input signals. For example, in an oscilloscope with two input channels (e.g. CH1, CH2), the oscilloscope in logic trigger mode may be set to trigger when, according to Boolean logic, CH1 is logically HI, OR when CH2 is logically HI. The specific voltage levels used by the instrument to determine when an input signal is logically HI or LO are generally selectable in the instrument. Most instruments contain preset levels corresponding to particular logic families (e.g. TTL, ECL, CMOS).

The behavior of the conventional logic trigger circuit just described, particularly the logical OR trigger mode, is correct according to Boolean logic, but is nevertheless limited in what types of input signal transitions it can recognize, and is unsatisfactory for some test and measurement instrument users. Embodiments of the present invention address these and other limitations of the prior art.

SUMMARY OF THE DISCLOSURE

Methods of triggering a test and measurement instrument include the step of generating a trigger signal in response to every occurrence of any one of a plurality of specified trigger events. A first specified trigger event occurs in at least a first input of a plurality of inputs of the test and measurement instrument and a second specified trigger event occurs in at least a second input. A trigger event specification may include at least one selected input from the plurality of inputs and a selected activity type. Some methods include configuring each of a plurality of event activity detectors to produce a logic signal in response to every occurrence of an event meeting the trigger event specification. In some methods, the event activity detectors produce pulses in the logic signals, and the logic signals are combined in a logical OR circuit to generate the trigger signal. Trigger circuits configured to perform these methods are also disclosed.

DETAILED DESCRIPTION

Figure 1A:
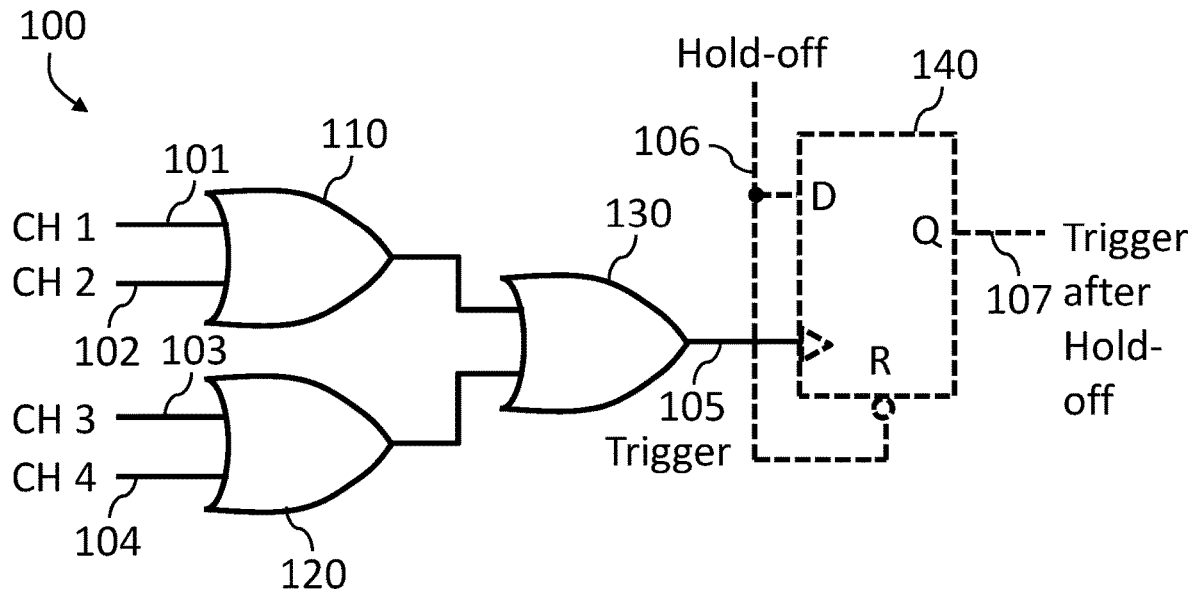
FIG. 1A is a schematic of a conventional logical OR trigger circuit.
Figure 1B:
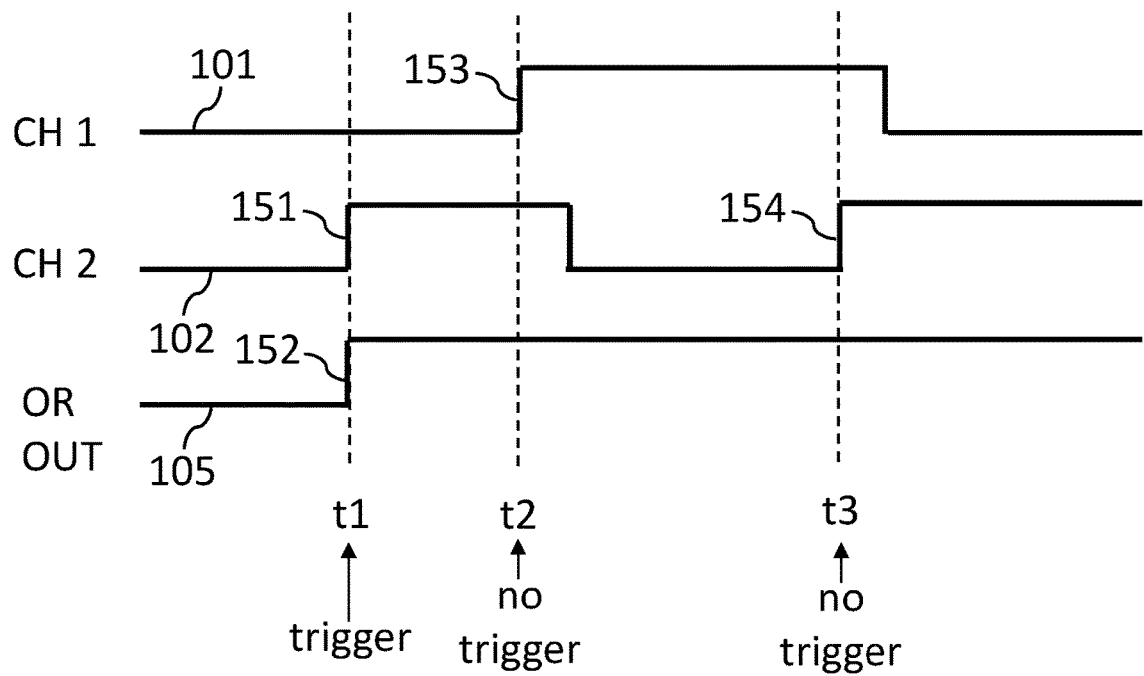
FIG. 1B is a timing diagram of the operation of the circuit of FIG. 1A.

FIGS. 1A and 1B illustrate the structure and operation of a traditional trigger circuit that performs the conventional logical OR trigger function. FIG. 1A, for example, illustrates a trigger circuit 100 for a test and measurement instrument, such as an oscilloscope, having four input channels 101, 102, 103, 104. The circuit 100 includes OR logic gates 110, 120, 130, which logically combine the input channels 101-104 to produce an OR output signal 105. The OR output signal 105 may be used directly at that point as a trigger signal in the test and measurement instrument. Alternatively, the circuit 100 may optionally include a flip-flop, such as a D flip-flop 140, to implement a trigger hold-off function by having a hold-off signal 106 connected to both the D input and the Reset input and using the OR output signal 105 as the clock input of the D flip-flop 140 to produce a trigger-after-hold-off signal 107.

FIG. 1B is a timing diagram illustrating the operation of the circuit 100. Assume for this example that all input channels 101-104 start at logic LO, and that input channels 3 and 4 103, 104 remain logic LO. At time t1, when channel 2 102 has a positive transition 151, the circuit 100 operates to cause the OR output signal 105 to also have a positive transition 152 to HI, thereby indicating a trigger event has occurred at time t1. However, at time t2, when channel 1 101 has a positive transition 153, the OR output signal 105 merely remains HI because channel 2 102 is still logically HI. Likewise, at time t3, when channel 2 102 goes HI 154, the OR output signal 105 merely remains HI because channel 1 101 is still logically HI. Therefore, the OR output signal 105 does not indicate that a trigger event has occurred at either time t2 or t3. In other words, if any one of the inputs to the circuit 100 is logically HI, changes in the logic state of any of the other inputs, particularly positive transitions, will not cause any change in the OR output signal, and will not be recognized as triggers.

While the behavior of the conventional logic OR trigger circuit 100 described above is correct according to Boolean logic, some test and measurement instrument users require a different behavior. Specifically, there is a need for a trigger circuit that generates a trigger when any of the inputs transition to logic HI, regardless of the state of the other inputs. To meet this stated need, and to enable several other new capabilities in the field of triggering test and measurement instruments, embodiments of the present invention include new methods of triggering, and new trigger circuits configured to perform the new methods.

According to some embodiments, a method of triggering a test and measurement instrument having a plurality of inputs includes a step of generating a trigger signal in response to every occurrence of any one of a plurality of specified trigger events, in which a first one of the plurality of specified trigger events occurs in at least a first one of the plurality of inputs and a second one of the plurality of specified trigger events occurs in at least a second one of the plurality of inputs. In some embodiments, the trigger signal is generated in continuous time; that is, asynchronously, rather than a state-machine-based operation.

For example, to create the particular desired alternative logic OR trigger circuit behavior described above, the plurality of specified trigger events may include a first trigger event specified to occur when a first input transitions to logic HI, and a second trigger event specified to occur when a second input transitions to logic HI. In such embodiments, the method generates a trigger signal in response to every occurrence of either, or both, of the first and second defined trigger events; that is, the method generates a trigger signal every time the first input transitions to logic HI as well as every time the second input transitions to logic HI.

Figure 2A:
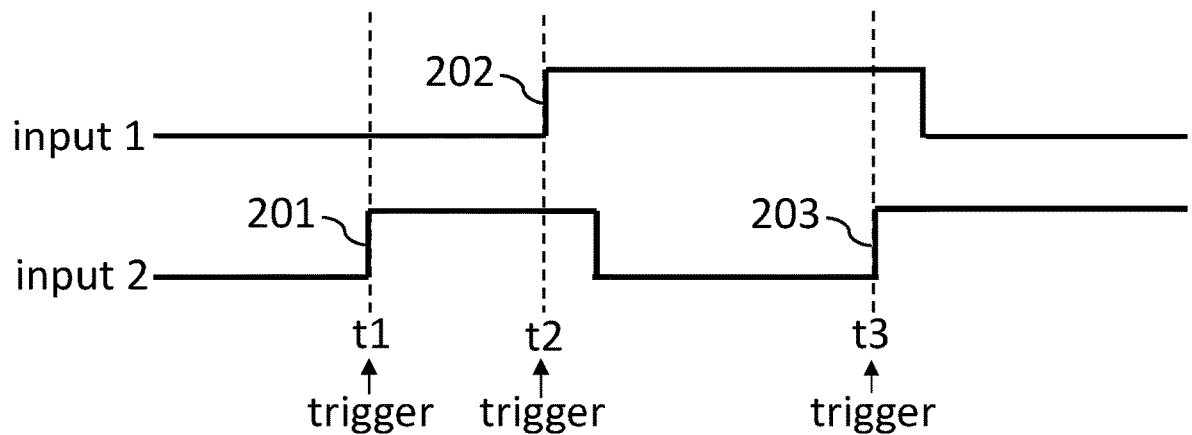
FIGS. 2A-2C are timing diagrams of the operation of trigger circuits configured to perform embodiments of the invention.

FIG. 2A is a timing diagram further illustrating the new behavior enabled by these embodiments. As shown in FIG. 2A, at time t1, when input 2 transitions to logic HI 201, a trigger signal is generated. Unlike the behavior illustrated in FIG. 1B, when input 1 transitions to logic HI 202 at time t2, a trigger signal is generated, even though input 2 is still logically HI. Likewise, when input 2 transitions to logic HI 203 at time t3, a trigger signal is generated, even though input 1 is still logically HI. Thus, in these embodiments, the trigger signal is generated in response to "every occurrence" of a positive transition on either input, regardless of the state of the other input. In contrast, the prior art circuit 100 generates a trigger signal in response to a positive transition of an input only when all of the other inputs are not already logically HI.

Figure 2B:
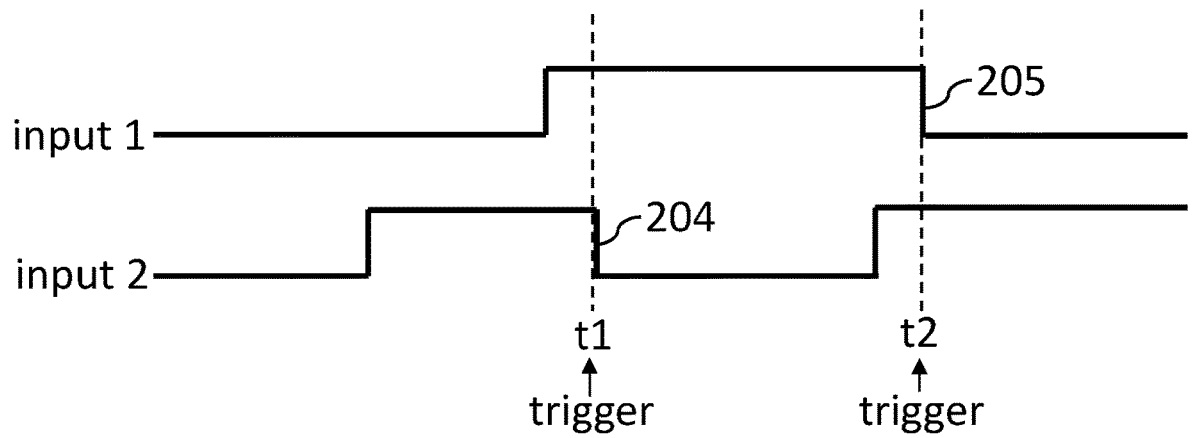
Figure 2C:
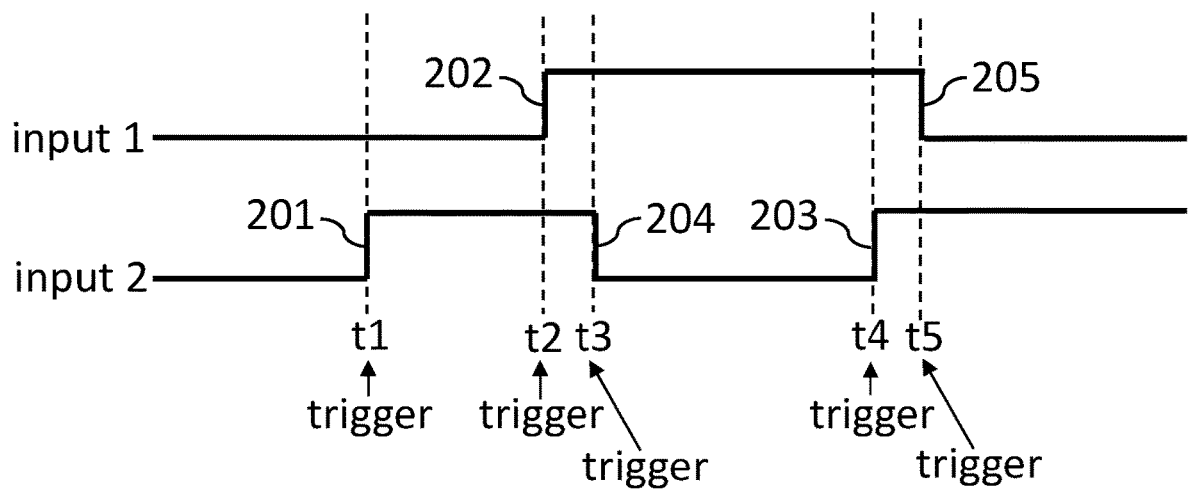

Rather than generating triggers for every occurrence of a positive transition, or rising edge, other embodiments include configuring a trigger circuit to generate triggers in response to every negative transition, or falling edge, occurring in two or more input signals, as illustrated in the FIG. 2B timing diagram with triggers being generated at times t1, t2 in response to falling edges 204, 205. Still other embodiments include generating triggers in response to every occurrence of any edge, rising or falling, occurring in any of a plurality of input signals, as illustrated in the FIG. 2C timing diagram with triggers being generated at times t1, t2, t3, t4, and t5 in response to edges 201-205. Such triggering capability is not possible in conventional oscilloscopes using conventional methods of triggering.

For purposes of this disclosure, a trigger "event" is a particular kind of signal activity on one or more particular inputs of the test and measurement instrument. Inherently in this context, an "event" must be detectable by the test and measurement instrument. That is, in order for the method to generate a trigger signal in response to an event, the event must be within the bandwidth of the instrument. Additionally, two events must be spaced by a certain minimum time period—typically defined by electrical characteristics of the particular components used in the instrument's trigger circuitry—in order for both events to be detectable. Furthermore, if a trigger hold-off function is implemented in the instrument's trigger circuitry, events occurring during the hold-off period will not be detectable for the purpose of generating a trigger.

The plurality of "specified trigger events" in response to which a trigger signal is generated may include a variety of different types of input signal activity. In some embodiments, the step of generating a trigger signal includes receiving a first trigger event specification, and receiving a second trigger event specification. The first and second trigger event specifications each include at least one selected input from the plurality of inputs of the test and measurement instrument, and a selected activity type. The first and second trigger event specifications may include different selected activity types. The trigger event specifications may be received from a user interface or from a programmatic interface to the test and measurement instrument.

A "specified trigger event" may be edge activity on an input channel. In these embodiments, one of the inputs of the test and measurement instrument is specified as the selected input and the specification activity type is selected as a rising edge, a falling edge, or either edge occurring in the input. For example, as already discussed above, and as illustrated in FIG. 2A, the first trigger event specification may include "input 1" as the selected input, and "rising edge" as the selected activity type. The second trigger event specification may include "input 2" as the selected input, and "rising edge" as the selected activity type. These two particular trigger event specifications result in the trigger signals being generated as illustrated in the FIG. 2A timing diagram.

Another "specified trigger event" may be a setup and hold violation. In these embodiments, one of the trigger event specifications includes "setup and hold" as the selected activity type. Since a trigger event specification may include more than one selected input from the plurality of inputs of the test and measurement instrument, when the selected activity type is setup and hold, one input may be selected as the clock source, and another input may be selected as the data source. In these embodiments, the specified trigger event may also include a selected edge of the clock source, rising or falling, and a selected setup and hold timing window. The method generates a trigger signal in response to every occurrence of a setup and hold violation—that is, when a transition of the selected data source input occurs within the selected setup and hold window of time around the selected edge of the selected clock source—in addition to generating a trigger signal in response to every occurrence of the other specified trigger event.

A "specified trigger event" may also be a signal level window violation. In these embodiments, one of the inputs of the test and measurement instrument is specified as the selected input and the specification activity type is selected as "window." In these embodiments, the specified trigger event may also include a selected window of analog signal levels, that is, a maximum threshold value and a minimum threshold value. The method generates a trigger signal in response to every occurrence of a window violation—that is, when the analog value of the selected input goes outside the selected window—in addition to generating a trigger signal in response to every occurrence of the other specified trigger event.

A "specified trigger event" may also be a pulse width. In these embodiments, one of the inputs of the test and measurement instrument is specified as the selected input and the specification activity type is selected as "pulse width." In these embodiments, the specified trigger event may also include a selected transition polarity, and a selected pulse width window, that is, a maximum pulse width and a minimum pulse width. The method generates a trigger signal in response to every occurrence of a qualifying pulse width in the selected input—that is, when the width of a pulse of the selected polarity occurring in the selected input is within the selected pulse width window—in addition to generating a trigger signal in response to every occurrence of the other specified trigger event.

A "specified trigger event" may also be a glitch, a runt, a timeout, a transition time or slew rate, a logic pattern, a logic state, a frequency/period or interval, an envelope, a bus data pattern, a serial data pattern, or other detectable events occurring in an input signal.

Figure 3:
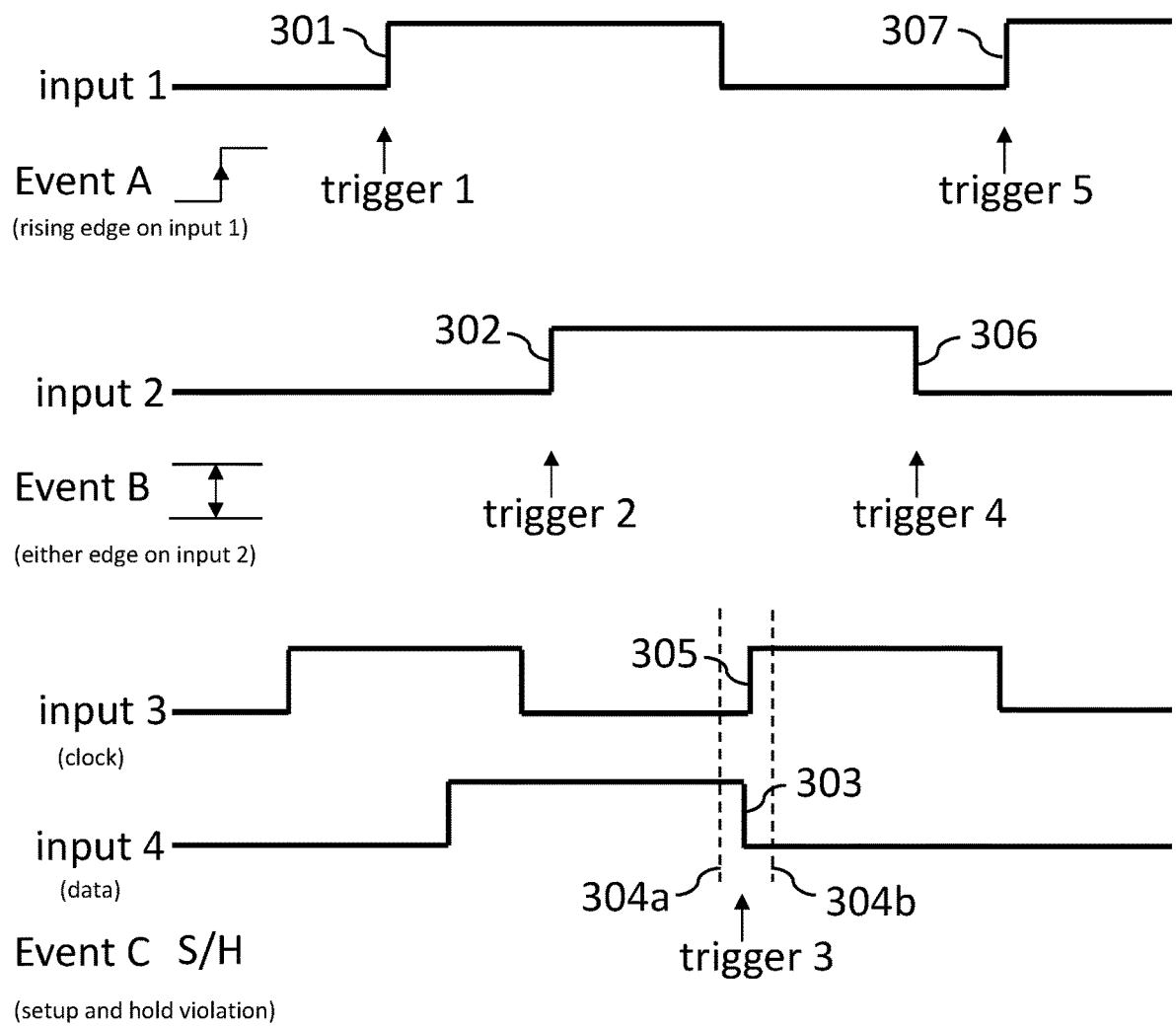
FIG. 3 is a timing diagram of the operation of a trigger circuit configured according to embodiments of the invention.

Thus, in general, embodiments enable specification of multiple specified trigger events, and the method generates a trigger signal in response to all detectable occurrences of any of those specified trigger events. In other words, if trigger events A, B, and C are specified, a trigger signal is generated in response to Event A occurring OR Event B occurring OR Event C occurring. For example, as illustrated in the FIG. 3 timing diagram, Event A is specified as a rising edge on input 1, Event B is specified as either edge on input 2, and Event C is specified as a setup and hold violation with input 3 defined as the clock signal and input 4 defined as the data signal. The method generates triggers for every occurrence of any one of Events A, B, and C. Accordingly, the following trigger signals are generated: trigger 1 in response to the rising edge 301 occurring in input 1; trigger 2 in response to the rising edge 302 occurring in input 2; trigger 3 in response to the setup and hold violation—the transition 303—occurring in input 4 within the defined setup and hold window 304a, 304b around the clock edge 305 occurring in input 3; trigger 4 in response to the falling edge 306 occurring in input 2; and trigger 5 in response to the rising edge 307 occurring in input 1. Thus, embodiments of the method enable highly flexible and configurable triggering behavior in a test and measurement instrument. Embodiments of the invention also include a test and measurement instrument with a trigger circuit configured to perform the method.

Figure 4:
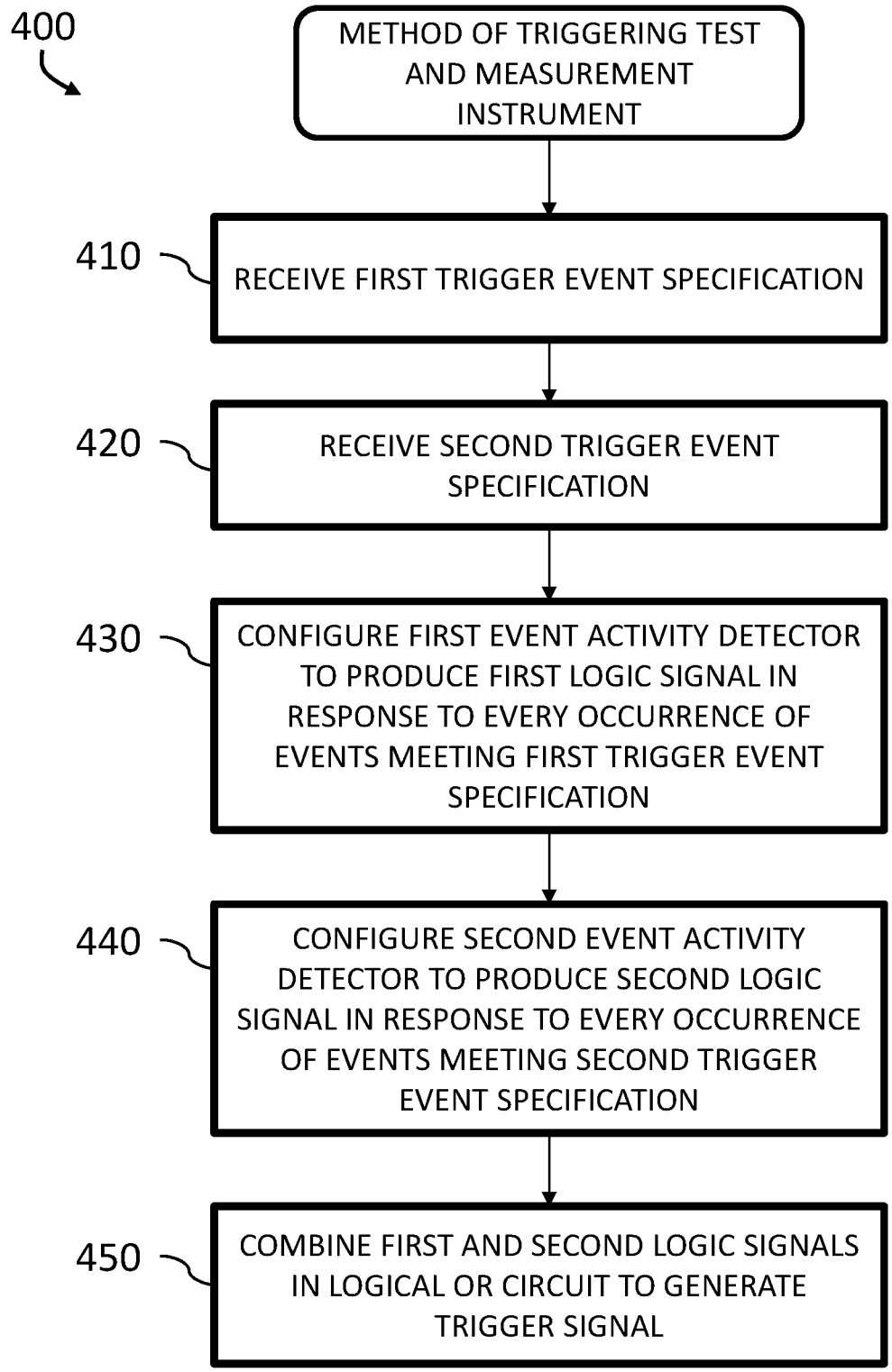
FIG. 4 is a flowchart of a method according to embodiments of the invention.

In some embodiments of the method, such highly flexible triggering behavior is achieved by having the step of generating a trigger signal include configuring event activity detector circuits. FIG. 4 illustrates the steps of a method 400 according to some of these embodiments. The method 400 includes a step 410 of receiving a first trigger event definition and a step 420 of receiving a second trigger event definition. The first and second trigger event definitions are as described and discussed above. The method 400 also includes a step 430 of configuring a first event activity detector to produce a first logic signal in response to every occurrence of an event meeting the first trigger event specification, and a step 440 of configuring a second event activity detector to produce a second logic signal in response to every occurrence of an event meeting the second trigger event specification. Lastly, the method 400 includes a step 450 of combining the first and second logic signals in a logical OR circuit to generate the trigger signal.

In some embodiments of the method 400, the first and second event activity detectors are each configured to produce a pulse in, respectively, the first and second logic signals in response to each occurrence of events meeting, respectively, the first and second trigger event specifications. Accordingly, when these first and second logic signal pulses are combined in a logical OR circuit in step 450, a pulse in the resulting trigger signal indicates a trigger. To enhance the detectability of events, the pulses produced by the event activity detectors are preferably generated with the minimum pulse width possible. In some embodiments, the pulses are produced so that they do not overlap in time. The minimum pulse width that may be generated therefore determines the minimum triggerable event timing resolution.

Figure 5:
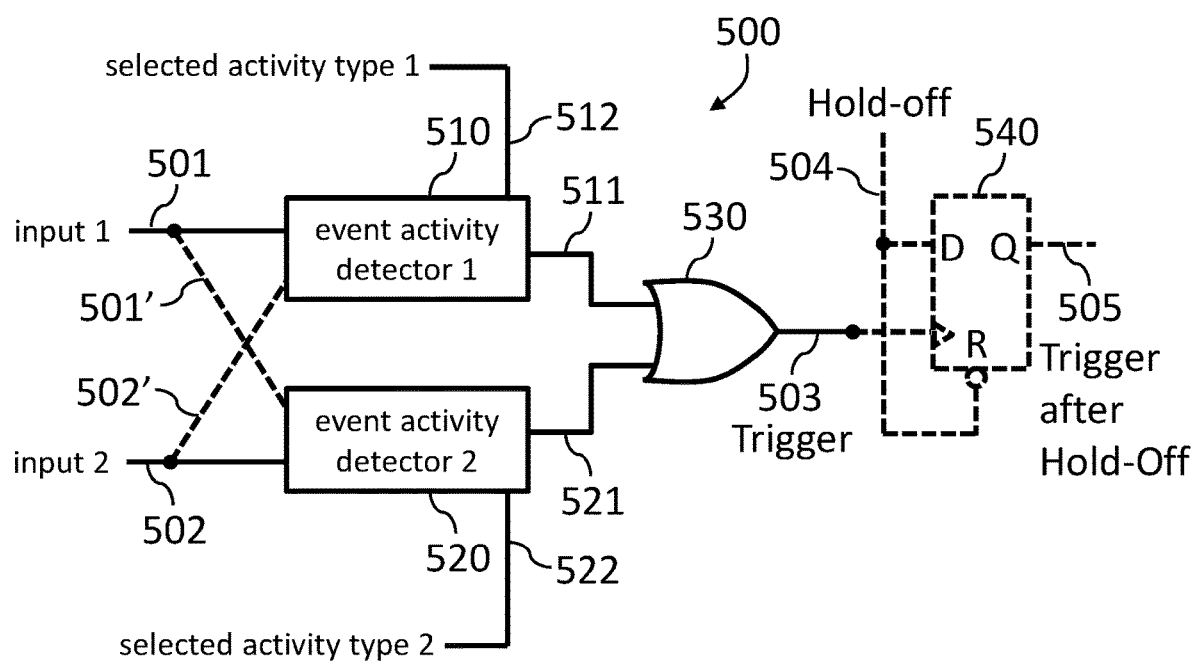
FIG. 5 is a schematic of a trigger circuit according to embodiments of the invention.

FIG. 5 illustrates a trigger circuit 500 configured to perform these embodiments of the method 400. The trigger circuit 500 includes a first event activity detector 510 and a second event activity detector 520. The first event activity detector 510 receives a first input 501 and the second event activity detector receives a second input 502. Optionally, in some embodiments, the first event activity detector 510 may also have another input 502', and the second event activity detector 520 may also have another input 501'. The first event activity detector 510 is configured to generate a pulse in a first logic signal 511 in response to every occurrence of a first selected activity type 512 occurring in at least the first input 501. The second trigger event activity detector 520 is configured to generate a pulse in a second logic signal 521 in response to every occurrence of a second selected activity type 522 occurring in at least the second input 502. The trigger circuit 500 also includes a logical OR circuit 530. The logical OR circuit 530 combines the first and second logic signals 511, 521 to generate a trigger signal 503. The trigger signal 503 will therefore indicate a trigger whenever either of the first or second event activity detectors 510, 520 generate a pulse. In some embodiments, there may be additional event activity detectors whose outputs also become inputs to the logical OR circuit 530.

The first and second selected activity types 512, 522 may be: a rising edge, a falling edge, either edge, a setup and hold violation, a window violation, a pulse width, a glitch, a runt, a timeout, a transition time or slew rate, a logic pattern, a logic state, a frequency/period or interval, an envelope, a bus data pattern, a serial data pattern, or other detectable types of activity occurring in an input signal. For most selected activity types, the event activity detectors 510, 520 only need to detect activity occurring in one input, i.e., respectively, inputs 501, 502. However, for some activity types, such as a setup and hold violation, the event activity detectors 510, 520 need to detect activity occurring in more than one input, e.g., inputs 501, 502' for event activity detector 510 and inputs 502, 501' for event activity detector 520. Also, for some selected activity types, the event activity detectors 510, 520 will need to receive additional event specifications. For example, if the selected activity type is pulse width, the event activity detector 510, 520 will also need to receive a polarity, and a minimum and maximum pulse width.

The circuit 500 may optionally include a hold-off function on the trigger signal output 503 by outputting the trigger signal 503 to the clock input of a flip-flop, such as D flip-flop 540. A hold-off signal 504 may be connected to both the D input and the Reset input of the flip-flop 540. The Q output of this flip-flop 540 then becomes the trigger signal after hold-off 505.

The circuit 500 may also optionally include a pass-through signal path for each input 501, 502, allowing these inputs to bypass the event activity detectors 510, 520, and become inputs directly to the logical OR circuit 530. Bypassing the event activity detectors 510, 520 causes the circuit 500 to merely perform the conventional "logic OR" trigger behavior discussed above.

Figure 6:
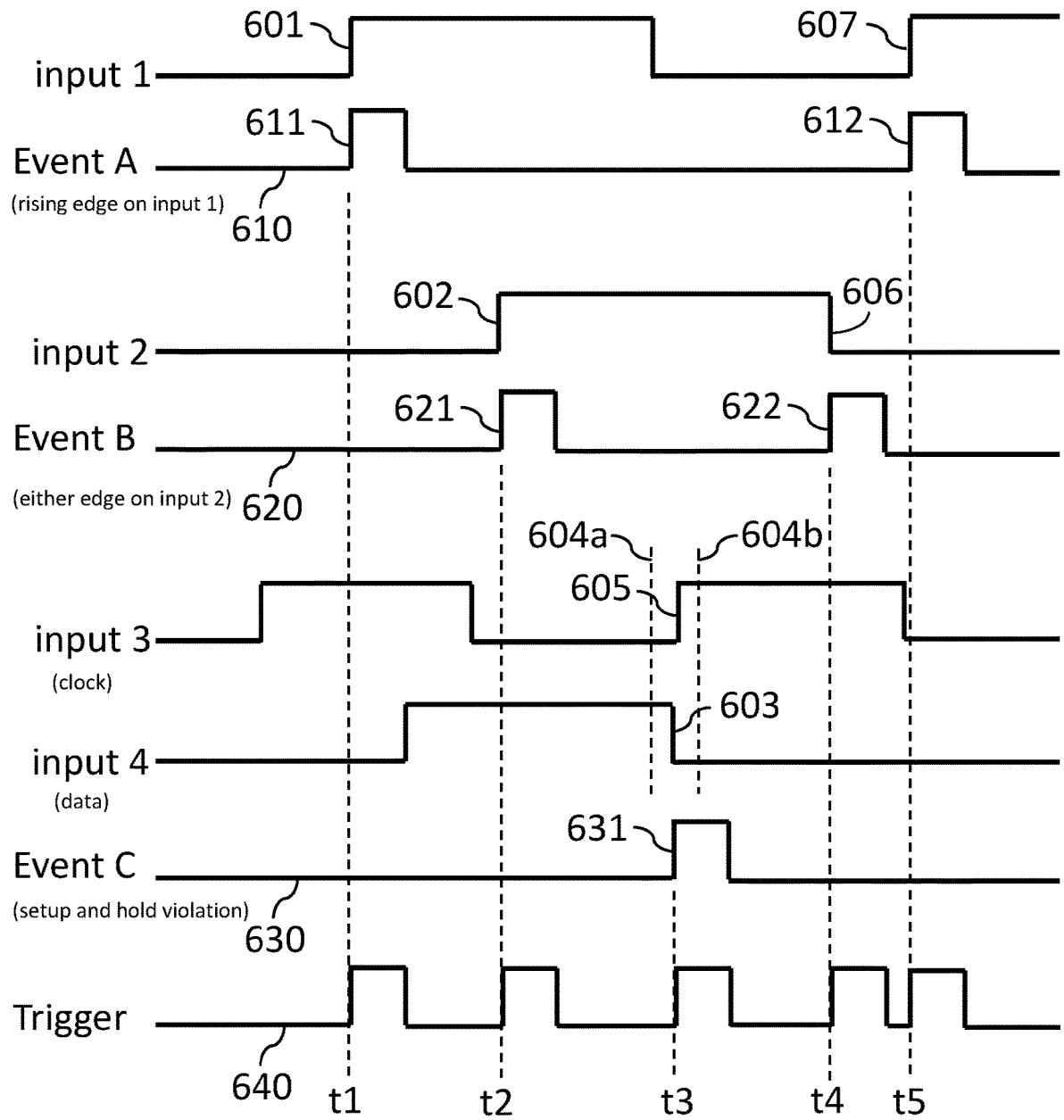
FIG. 6 is a timing diagram of the operation of a trigger circuit configured to perform embodiments of the invention.

FIG. 6 is a timing diagram showing an example of the behavior of a circuit such as the circuit 500, configured, according to embodiments of the method 400, to generate triggers for every occurrence of any one of three events A, B, and C. Event A is defined as rising edges on input 1. Event B is defined as either edge on input 2. Event C is defined as setup and hold violations with input 3 as the clock and input 4 as the data source. Accordingly, a first event activity detector is configured to generate pulses 611, 612 in a logic signal 610 in response to, respectively, rising edges 601, 607. A second event activity detector is configured to generate pulses 621, 622 in a logic signal 620 in response to, respectively, edges 602, 606. A third event activity detector is configured to generate a pulse 631 in a logic signal 630 in response to edge 603 occurring within a window 604a, 604b around clock edge 605. The logic signals 610, 620, 630 are combined in a logical OR circuit to generate a trigger signal 640. The trigger signal 640 therefore has pulses occurring at times t1, t2, t3, t4, and t5, each indicating an occurrence of a trigger event.

Returning to the method 400 illustrated in FIG. 4, in alternative embodiments of the method 400, the event activity detectors are configured to produce an active state of their respective output logic signals in response to events, rather than producing pulses. In these embodiments of the method 400, the first and second logic signals are not directly combined in a logic OR circuit. Rather, in an intermediate step, the first and second logic signals are each provided as the clock input to, respectively, a first and second flip-flop. A hold-off signal is provided as the Reset input of both flip-flops. The outputs of both flip-flops are then combined in a logical OR circuit to generate the trigger signal. In these embodiments, the trigger signal is conditioned by the hold-off signal. That is, the trigger signal is not generated unless the hold-off signal is not holding the flip-flops in reset.

Figure 7:
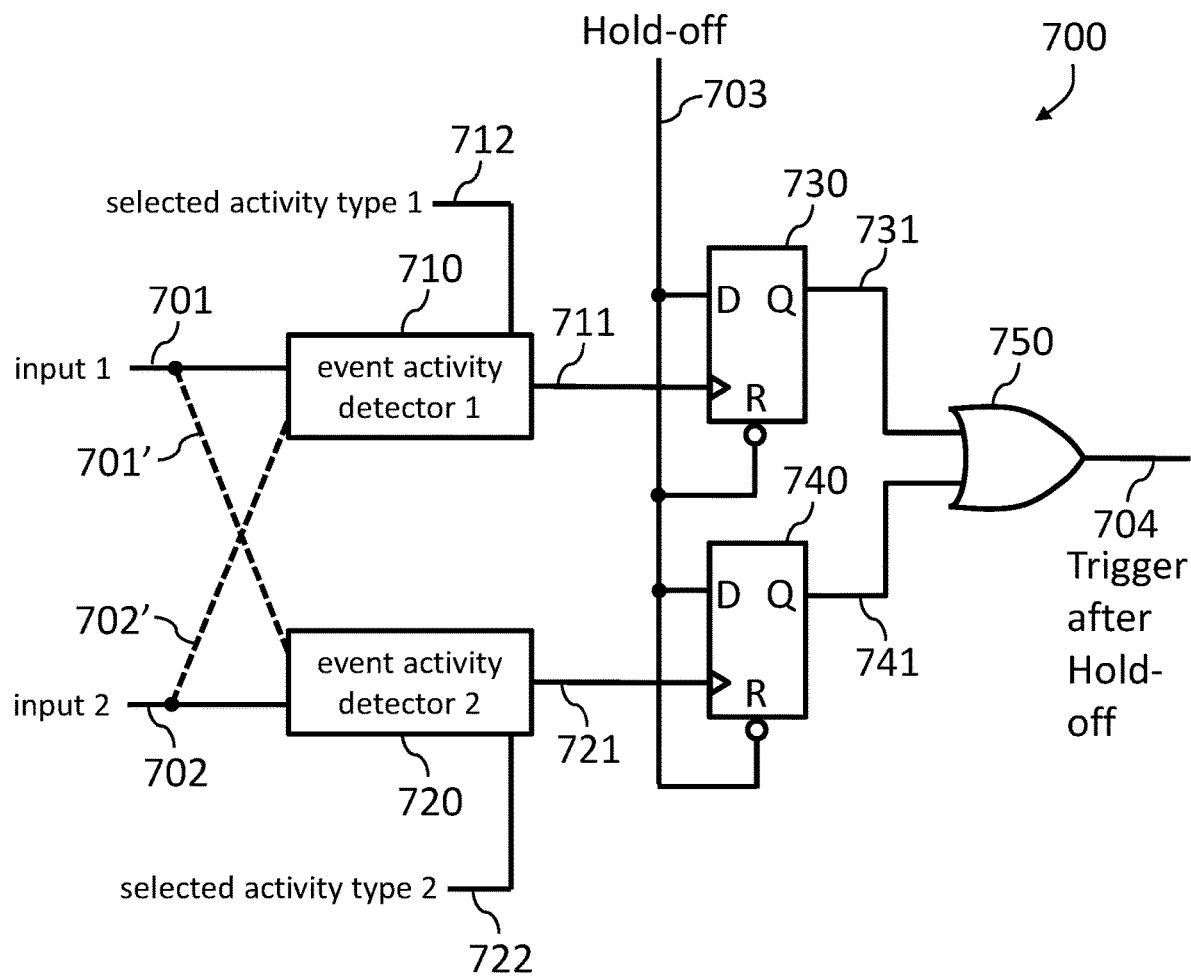
FIG. 7 is a schematic of a trigger circuit according to embodiments of the invention.

FIG. 7 illustrates an example of a circuit 700 configured to perform these alternative embodiments of the method 400. The circuit 700 includes a first event activity detector 710 having at least a first input 701, and optionally, an input 702'. The circuit 700 also includes a second event activity detector 720 having at least a second input 702, and optionally, an input 701'. The first event activity detector 710 is structured to generate an active state in a first logic signal 711 in response to every occurrence of a first selected activity type 712 occurring in at least the first input 701. Likewise, the second event activity detector 720 is structured to generate an active state in a second logic signal 721 in response to every occurrence of a second selected activity type 722 occurring in at least the second input 702. The circuit 700 also includes first and second flip-flops 730, 740. The first flip-flop 730 has the first logic signal 711 as its clock input, and the second flip-flop 740 has the second logic signal 721 as its clock input. Both the first and second flip-flops 730, 740 have a hold-off signal 703 as their Reset inputs. The outputs 731, 741 of the first and second flip-flops 730, 740 are the inputs of a logical OR circuit 750. The logical OR circuit combines the outputs 731, 741 to produce the trigger signal 704. The trigger signal 704 is therefore conditioned by the hold-off signal 703. That is, triggers will not be generated when the hold-off signal 703 is in an active state.

Embodiments such as the circuit 700 are generally able to operate at a higher speed than embodiments in which the event activity detectors are configured to generate pulses, such as the circuit 500 in FIG. 5. In preferred embodiments, the first and second flip-flops 730, 740 are D flip-flops which have their D inputs tied to the hold-off signal 703, and which have an active-low Reset input, as illustrated in FIG. 7.

Although specific embodiments of the invention have been illustrated and described for purposes of illustration, various modifications may be made without departing from the spirit and scope of the invention. Accordingly, the invention should not be limited except as by the appended claims.

What is claimed is:

1. A method of triggering a test and measurement instrument having a plurality of inputs, an acquisition system including a clock and a memory, and a trigger system, the method comprising:
   receiving a first trigger event specification including a first input of the plurality of inputs;
   receiving a second trigger event specification including a second input of the plurality of inputs, different than the first input;
   monitoring signal activity on the plurality of inputs and generating, by the trigger system, a trigger signal in response to a first occurrence of either the first trigger event or the second trigger event; and
   causing the acquisition system to store data from the plurality of inputs in the memory in response to the trigger signal,
   in which the trigger system operates asynchronously from and faster than the clock of the acquisition system; the method further comprising:
   configuring a first event activity detector to produce a first event signal upon detection of an occurrence of the first trigger event;
   configuring a second event activity detector to produce a second event signal upon detection of an occurrence of the second trigger event;
   logically combining, in a logic circuit, the first and second event signals to generate the trigger signal;
   receiving a hold-off signal;
   conditioning, by a first flip-flop coupled between the first event activity detector and the logic circuit, the first event signal using the hold-off signal; and
   conditioning, by a second flip-flop coupled between the second event activity detector and the logic circuit, the second event signal using the hold-off signal.

2. The method of claim 1, in which:
   the first trigger event specification includes a first selected activity type; and
   the second trigger event specification includes a second selected activity type.

3. The method of claim 2 in which the first and second selected activity types are selected from the group consisting of rising edge, falling edge, either edge, setup and hold, window, pulse width, glitch, runt, timeout, transition time, pattern, frequency, period, bus, envelope, and serial.

4. The method of claim 1 in which the first and second trigger event specifications are received through a user interface.

5. The method of claim 1 in which the first and second trigger event specifications are received through a programmatic interface.

6. The method of claim 1 in which:
the first event activity detector is configured to produce a first pulse of the first event signal upon detection of the first trigger event; and
the second event activity detector is configured to produce a second pulse of the second event signal upon detection of the second trigger event.

7. The method of claim 6 in which the width of the first and second pulses determines the minimum triggerable event timing resolution of the trigger system.

8. A test and measurement instrument comprising:
a plurality of inputs;
a trigger system including
a first event activity detector configured to detect a first trigger event occurring in at least a first input of the plurality of inputs, and configured to produce a first event signal upon detection of the first trigger event,
a second event activity detector configured to detect a second trigger event occurring in at least a second input of the plurality of inputs, different than the first input, and configured to produce a second event signal upon detection of the second trigger event, and
a logic circuit coupled to the first and second event activity detectors and structured to generate a trigger signal in response to a first occurrence of either the first trigger event or the second trigger event; and
an acquisition system having a clock and configured to store data from the plurality of inputs in a memory in response to the trigger signal,
in which the trigger system operates asynchronously from and faster than the clock of the acquisition system, and
in which the trigger system further includes:
a hold-off signal input;
a first flip-flop coupled to the hold-off signal and the logic circuit; and
a second flip-flop coupled to the hold-off signal and the logic circuit; and
in which the logic circuit is coupled to the first event activity detector through the first flip-flop, the logic circuit is coupled to the second event activity detector through the second flip-flop, and the first and second flip-flops are configured to condition the first and second event signals using the hold-off signal.

9. The test and measurement instrument of claim 8 in which:
the first event activity detector is configured by receiving a first trigger event specification including at least the first input and a first selected activity type; and
the second event activity detector is configured by receiving a second trigger event specification including at least the second input and a second selected activity type.

10. The test and measurement instrument of claim 9 in which the first and second selected activity types are selected from the group consisting of rising edge, falling edge, either edge, setup and hold, window, pulse width, glitch, runt, timeout, transition time, pattern, frequency, period, bus, envelope, and serial.

11. The test and measurement instrument of claim 9, further comprising a user interface, in which the first and second trigger event specifications are received through the user interface.

12. The test and measurement instrument of claim 9, further comprising a programmatic interface, in which the first and second trigger event specifications are received through the programmatic interface.

13. The test and measurement instrument of claim 8 in which:
the first event activity detector is configured to produce a first pulse of the first event signal upon detection of the first trigger event; and
the second event activity detector is configured to produce a second pulse of the second event signal upon detection of the second trigger event.

14. The test and measurement instrument of claim 13 in which the width of the first and second pulses determines the minimum triggerable event timing resolution of the trigger system.

* * * * *